(12) United States Patent
Lee et al.

(10) Patent No.: US 10,890,796 B2
(45) Date of Patent: Jan. 12, 2021

(54) ELECTRONIC DEVICE INCLUDING EMISSIVITY CONTROL LAYER

(71) Applicant: Samsung Electronics Co., Ltd., Suwon-si (KR)

(72) Inventors: Ki Taek Lee, Hwaseong-si (KR); Hae Jung Yang, Suwon-si (KR); Hee Youb Kang, Seoul (KR); Young Rok Oh, Seoul (KR); Hee Chul Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/441,653

(22) Filed: Jun. 14, 2019

(65) Prior Publication Data

US 2020/0241335 A1 Jul. 30, 2020

(30) Foreign Application Priority Data

Jan. 25, 2019 (KR) .......................... 10-2019-0010127

(51) Int. Cl.
  *G02F 1/1334* (2006.01)
  *H05K 7/20* (2006.01)
  *G02F 1/1347* (2006.01)

(52) U.S. Cl.
  CPC ........ *G02F 1/1334* (2013.01); *G02F 1/13476* (2013.01); *H05K 7/20963* (2013.01)

(58) Field of Classification Search
  CPC .................................................. G02F 1/1334
  See application file for complete search history.

(56) References Cited

U.S. PATENT DOCUMENTS

| | | | |
|---|---|---|---|
| 6,215,348 B1 | 4/2001 | Steensgaard-Madsen | |
| 7,929,281 B2 | 4/2011 | Szolyga et al. | |
| 8,467,835 B2 | 6/2013 | Lee et al. | |
| 9,971,194 B2 | 5/2018 | Brecht et al. | |
| 2003/0122771 A1* | 7/2003 | Sumiyoshi | G02F 1/133621 345/102 |
| 2006/0076881 A1* | 4/2006 | Kim | G02F 1/133617 313/496 |
| 2009/0218041 A1 | 9/2009 | Dean et al. | |

(Continued)

FOREIGN PATENT DOCUMENTS

| | | | | |
|---|---|---|---|---|
| JP | 2009-205772 A | | 9/2009 | |
| JP | 2009205772 | * | 9/2009 | .............. G11B 7/12 |

*Primary Examiner* — Sang V Nguyen
(74) *Attorney, Agent, or Firm* — Harness, Dickey & Pierce, P.L.C.

(57) ABSTRACT

An electronic device includes a circuit board including at least one electronic component, a housing accommodating the circuit board, an emissivity control layer disposed in an upper portion of the circuit board and transmitting radiant heat generated by the electronic component, and a temperature controller controlling an amount of the radiant heat transmitted to the housing by adjusting the emissivity of the emissivity control layer. The temperature controller may adjust the emissivity of the emissivity control layer to a first range value, when the electronic device is in an idle state, not performing a foreground operation, and may adjust the emissivity of the emissivity control layer to a second range value, lower than the first range value, when the electronic device is in a busy state, performing the foreground operation.

20 Claims, 7 Drawing Sheets

(56) References Cited

U.S. PATENT DOCUMENTS

| | | | |
|---|---|---|---|
| 2011/0108812 A1* | 5/2011 | Sumita | H01L 27/326 257/40 |
| 2013/0021549 A1* | 1/2013 | Fujita | H01L 51/5271 349/41 |
| 2015/0002769 A1 | 1/2015 | Kalyanasundaram et al. | |
| 2015/0090433 A1 | 4/2015 | Tamura | |
| 2015/0362776 A1* | 12/2015 | Jikumaru | H01L 27/1248 349/12 |
| 2017/0075169 A1* | 3/2017 | Hayama | G02F 1/1368 |
| 2018/0157098 A1* | 6/2018 | Choung | G02F 1/133516 |
| 2019/0103296 A1* | 4/2019 | Ji | H01L 21/67115 |
| 2019/0121205 A1* | 4/2019 | Lazo Martinez | G02F 1/133617 |
| 2019/0265527 A1* | 8/2019 | Misaki | H01Q 3/34 |

\* cited by examiner

ELECTRONIC DEVICE INCLUDING EMISSIVITY CONTROL LAYER

CROSS-REFERENCE TO RELATED APPLICATION(S)

This application claims benefit of priority to Korean Patent Application No. 10-2019-0010127 filed on Jan. 25, 2019 in the Korean Intellectual Property Office, the disclosure of which is incorporated herein by reference in its entirety.

BACKGROUND

1. Field

The present inventive concepts relate to an electronic device including an emissivity control layer.

2. Description of Related Art

Recently, as the tendency toward ultra-miniaturization and ultra-thinness in electronic products has accelerated, various electronic components used in electronic products are becoming highly integrated and miniaturized. Such highly integrated and miniaturized electronic components generate more heat during operations of the electronic product. When the temperature of the electronic components sharply rises, the performance or lifetime of the electronic components may deteriorate rapidly. In addition, when the temperature of the electronic product case sharply rises, a safety problem, such as a user being burned, or the like, may occur. Therefore, heat dissipation characteristics of the electronic product may be important parameters for ensuring product performance and user safety.

The electronic product generally uses a material having a high emissivity to emit radiant heat, generated by various electronic components, externally. However, as a temperature of electronic components rapidly reaches a critical temperature due to the high emissivity of the electronic product, a problem in which the time to enter the performance throttling also becomes faster, may occur.

SUMMARY

Example embodiments of the present inventive concepts provide an electronic device and operation method thereof which may efficiently control a device temperature using an emissivity control layer.

According to some example embodiments of the present inventive concepts, an electronic device may include: a circuit board including at least one electronic component; a housing accommodating the circuit board; an emissivity control layer disposed in an upper portion of the circuit board and transmitting radiant heat generated by the electronic component; and a temperature controller controlling an amount of the radiant heat transmitted to the housing by adjusting emissivity of the emissivity control layer. The temperature controller may adjust the emissivity of the emissivity control layer to a first range value when the electronic device is in an idle state, not performing a foreground operation, and may adjust the emissivity of the emissivity control layer to a second range value, lower than the first range value, when the electronic device is in a busy state, performing the foreground operation.

In addition, according to some example embodiments of the present inventive concepts, an electronic device may include: a first emissivity control layer disposed to be spaced apart in an upper portion of a circuit board on which at least one electronic component is mounted, and having variable emissivity to adjust a transmission amount of radiant heat generated by the electronic component; a first dissipation film disposed on the first emissivity control layer and diffusing heat transmitted from the first emissivity control layer; a second emissivity control layer disposed to be spaced apart in a lower portion of the circuit board, and having variable emissivity to adjust the transmission amount of the radiant heat; a second dissipation film disposed on the second emissivity control layer, and diffusing heat transmitted from the second emissivity control layer; and a temperature controller individually controlling the emissivity of each of the first and second emissivity control layers by adjusting a power level applied to each of the first and second emissivity control layers.

In addition, according to some example embodiments of the present inventive concepts, an electronic device may include: a circuit board on which at least one electronic component is mounted; a housing accommodating the circuit board; first to third layers disposed to be spaced apart on a lower portion and both side surfaces of the circuit board, and having variable thermal transmittance to control an amount of radiant heat generated by the electronic component transmitted to the housing; and a temperature controller controlling the thermal transmittance of the first to third layers by adjusting a power level applied to the first to third layers by adjusting the emissivity of the first to third layers. Each of the first to third layers may include a transmission layer in which an variable emissivity depending on whether the electronic device is in an idle state, not performing a foreground operation, and a heat dissipation film diffusing the radiant heat transmitted from the transmission layer.

In addition, according to some example embodiments of the present inventive concepts, a method for controlling a temperature of an electronic device may include: a step of determining whether the electronic device is in an idle state, not performing a foreground operation; a step of adjusting the emissivity of the emissivity control layer in the electronic device to a first range value when the electronic device is in the idle state; and a step of adjusting the emissivity of the emissivity control layer to a second range value, lower than the first range value, when the electronic device is in a busy state, performing a foreground operation.

In addition, according to some example embodiments of the present inventive concepts, a method for controlling a temperature of an electronic device may include: a step of determining whether the electronic device is in an idle state, not performing a foreground operation; a step of adjusting emissivity of an emissivity control layer in the electronic device to a first range value when the electronic device is in the idle state; a step of confirming whether an internal temperature of the electronic device exceeds a predetermined (or alternatively, given) critical temperature when the electronic device is in a busy state, performing the foreground operation; and a step of adjusting the emissivity of the emissivity control layer to the first range value or a second range value, lower than the first range value depending on whether the internal temperature of the electronic device exceeds the critical temperature.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
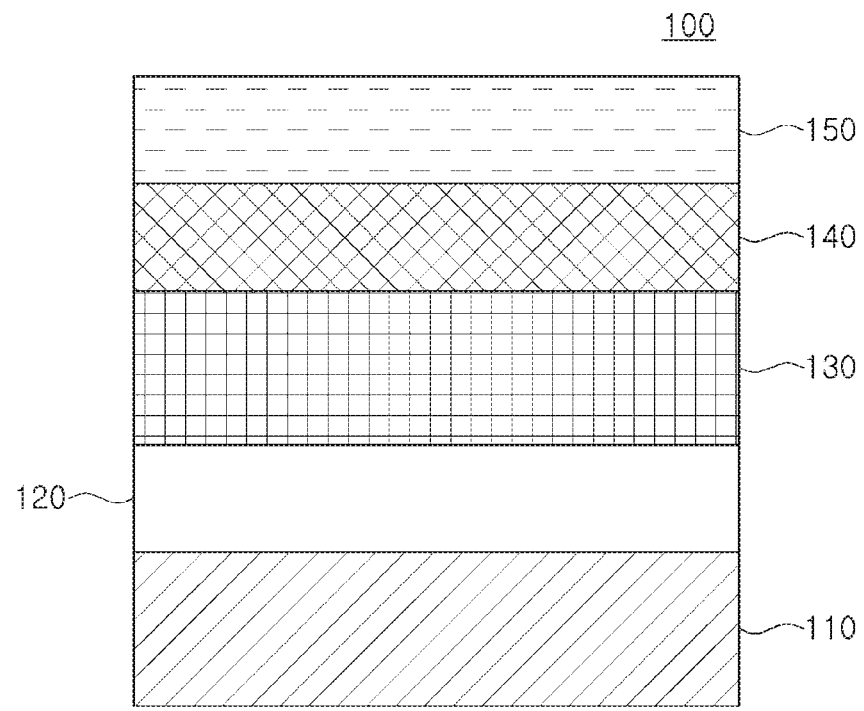
FIG. 1 is a cross-sectional view of an electronic device according to some example embodiments of the present inventive concepts.

Hereinafter, some example embodiments of the present disclosure will be described in detail with reference to the accompanying drawings. Further, in the drawings, elements having the same functions, within the same scope of the inventive concepts, will be designated by the same reference numerals.

FIG. 1 is a cross-sectional view of an electronic device according to some example embodiments of the present inventive concepts.

Referring to FIG. 1, an electronic device 100 may include a circuit board 110, an emissivity control layer 130 disposed to be spaced apart from an upper portion of the circuit board 110 by an air gap 120, and/or a dissipation film 140 and/or a housing 150, which are sequentially disposed on the emissivity control layer 130. Here, the upper portion of the circuit board 110 may refer to a direction in which the circuit board 110 faces the housing 150.

The circuit board 110 may be a driving circuit board on which various electronic components necessary for an operation of the electronic device 100 are mounted. For example, the circuit board 110 may be a PCB board in which a circuit pattern electrically connecting various electronic components is formed by a printing process.

The electronic component mounted on the circuit board 110 may include various semiconductor chips, and may function as a heat source during its operation. The heat generated by the circuit board 110 may include conductive heat transmitted along the circuit board 110 and/or radiant heat emitted externally by the air gap 120.

The electronic device 100 may control the radiant heat emitted to the upper portion of the circuit board 110 to be transmitted to the heat dissipation film 140 by dynamically adjusting the emissivity of the emissivity control layer 130.

For example, the electronic device 100 may reduce an amount of radiant heat transmitted to the heat dissipation film 140 by lowering the emissivity of the emissivity control layer 130 in a busy state. The busy state may refer to a state in which the electronic device 100 performs a foreground operation that processes various commands input from a user and/or other external devices. The electronic device 100 may suppress a rapid temperature rise of the housing 150 by reducing the amount of radiant heat transmitted to the heat radiation film 140.

In addition, the electronic device 100 may increase the amount of radiant heat transmitted to the heat dissipation film 140 by increasing the emissivity of the emissivity control layer 130 in an idle state. The idle state may refer to a state in which the electronic device 100 does not perform a foreground operation that processes various commands input from a user or other external devices. The electronic device 100 may maintain temperatures of various electronic components in the electronic device 100 within a predetermined (or alternatively, given) critical temperature range by increasing the amount of radiant heat transmitted to the heat dissipation film 140.

In some example embodiments, the electronic device 100 may adjust the emissivity of the emissivity control layer 130 by applying or cutting off power to the emissivity control layer 130. The emissivity control layer 130 may be formed of a material having different emissivity depending on whether power is applied or not. For example, the emissivity control layer 130 may include a polymer dispersed liquid crystal (PDLC) layer, a polymer stabilized cholesteric texture (PSCT) layer, and/or a suspended particle device (SPD) layer as a transmission layer. Hereinafter, some example embodiments of the present inventive concepts will be described on the assumption that the emissivity control layer 130 includes the PDLC transmission layer. It should be noted, however, that this is merely an example for convenience of explanation, and the present inventive concepts are not limited thereto.

Figure 2:
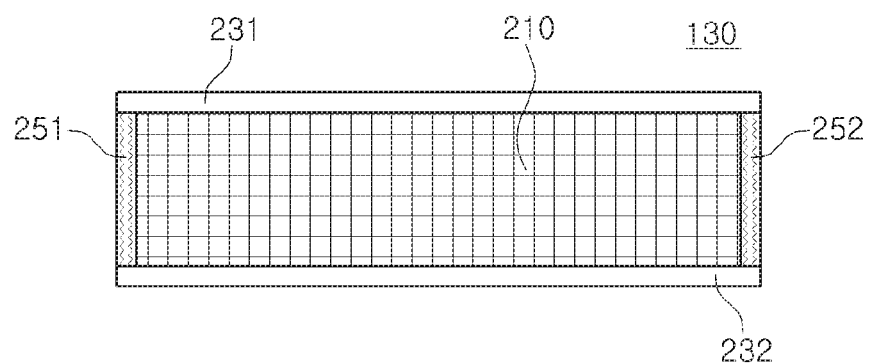
FIG. 2 is a cross-sectional view of the emissivity control layer of FIG. 1.

FIG. 2 is a cross-sectional view of an emissivity control layer including a PDLC transmission layer.

Figure 3A:
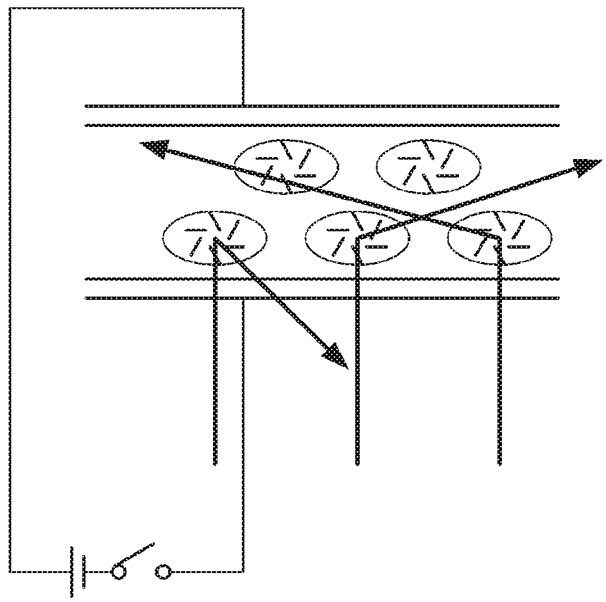
FIG. 3A is a view illustrating a case in which power is cut off to a PDLC transmission layer applicable to some example embodiments of the present inventive concepts.
Figure 3B:
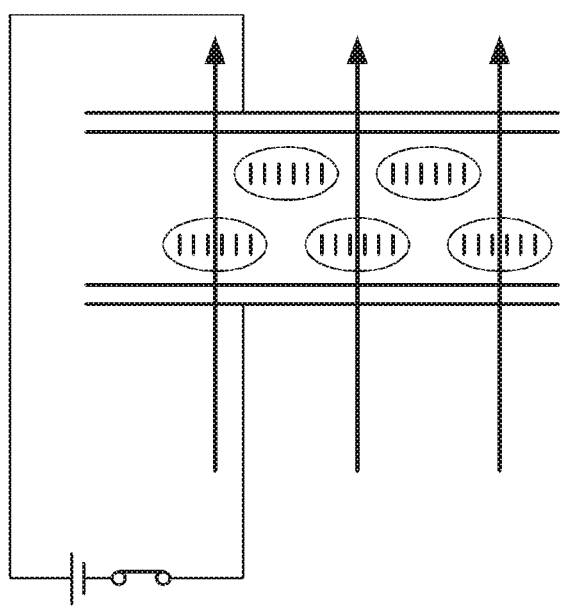
FIG. 3B is a view illustrating a case in which power is applied to a PDLC transmission layer applicable to some example embodiments of the present inventive concepts.

FIG. 3A is a view illustrating molecular arrangement and permeability when power is cut off to the PDLC transmission layer, and FIG. 3B is a view illustrating molecular arrangement and permeability when power is applied to the PDLC transmission layer.

First, referring to FIG. 2, an emissivity control layer 130 may include a PDLC transmission layer 210, a first electrode layer 231 formed on an upper portion of the PDLC transmission layer 210 and/or a second electrode layer 232 formed on a lower portion of the PDLC transmission layer 210. At least one of the first and second electrode layers 231 and 232 may be formed using a transparent electrode material. For example, at least one of the first and second electrode layers 231 and 232 may be formed using Indium-Tin-Oxide (ITO), Al doped ZnO (AZO), AgNW, and/or a grapheme material. At least one of the first and second electrode layers 231 and 232 may be formed integrally with the heat dissipation film 140.

The emissivity control layer 130 may further include at least one of electrode connection layers 251 and 252, disposed on a side surface of the PDLC transmission layer 210. In some example embodiments, at least one of the electrode connection layers 251 and 252 may be a flexible PCB.

The electronic device 100 may apply power to the PDLC transmission layer 210 through the first and second electrode layers 231 and 232 under a control of a controller. For example, the electronic device 100 may apply power to the PDLC transmission layer 210 through the first and second electrode layers 231 and 232 under a control of a power management unit PMU.

A power level applied to the PDLC transmission layer 210 may be controlled by a temperature controller. For example, when an operating state of the electronic device 100 is an idle state, not performing a foreground operation, the temperature controller may apply power having a first range value to the PDLC transmission layer 210 through the first and second electrode layers 231 and 232. When an operating state of the electronic device 100 is a busy state, performing a foreground operation, the temperature controller may apply power having a second range value to the PDLC transmission layer 210 through the first and second electrode layers 231 and 232. The second range value may be less than the first range value.

The PDLC transmission layer 210 may include a polymer formed in a network structure and liquid crystal molecules, uniformly dispersed in the polymer. Optical refractive indexes of the polymer and the liquid crystal molecules in the PDLC transmission layer 210 may be changed depending on whether the power is applied to the PDLC transmission layer 210 or not.

Referring to FIG. 3A, in a state in which power is cut off to the PDLC transmission layer 210, liquid crystal molecules in the PDLC transmission layer 210 may be randomly arranged. In a state in which the liquid crystal molecules in the PDLC transmission layer 210 are randomly arranged, light incident on the PDLC transmission layer 210 may be scattered due to a difference in refractive indexes of the polymer and the liquid crystal molecules.

Referring to FIG. 3B, in a state in which power is applied to the PDLC transmission layer 210, the liquid crystal molecules in the PDLC transmission layer 210 may be arranged in a direction parallel to an electric field. In a state in which the liquid crystal molecules in the PDLC transmission layer 210 are arranged in the direction parallel to the electric field, as the refractive index of the polymer and the refractive indexes of the liquid crystal molecules become equal to each other, light incident on the PDLC transmission layer 210 may transmit or pass the PDLC transmission layer 210.

As described above, the electronic device 100 may block or pass the light incident on the PDLC transmission layer 210 depending on whether power is applied to the PDLC layer 210 or not. Similarly, the electronic device 100 may block or pass radiant heat transmitted to the PDLC transmission layer 210 depending on whether power is applied to the PDLC transmission layer or not.

Hereinafter, some example embodiments of the present inventive concepts will be described on the assumption that the emissivity control layer 130 includes the PDLC transmission layer 210 as illustrated in FIG. 2. However, it should be noted that it is merely for convenience of explanation; however, the present inventive concepts are not limited thereto.

Figure 4A:
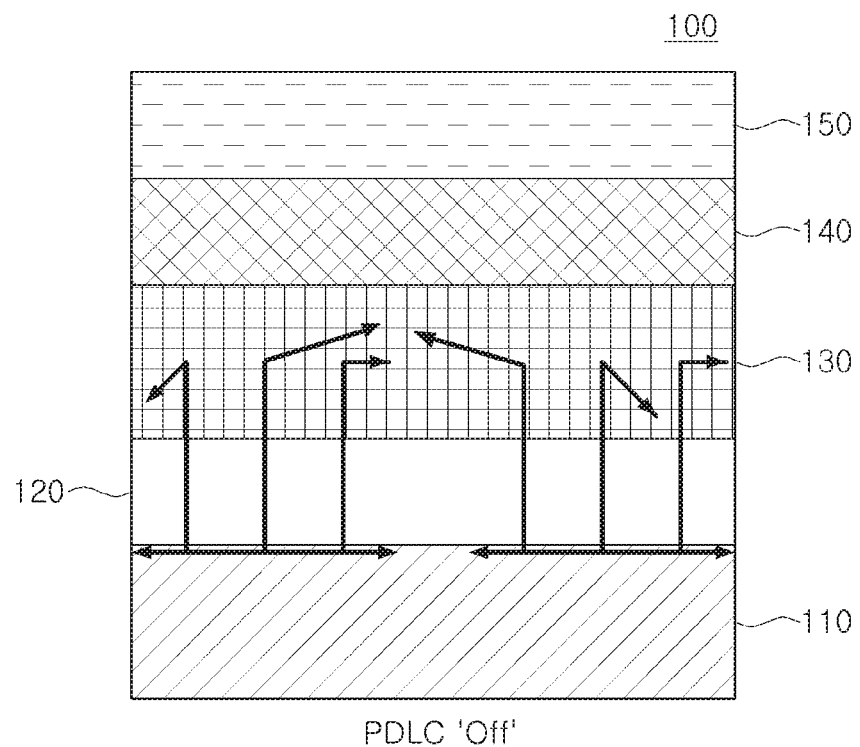
FIG. 4A is a view illustrating a case in which power is cut off to the emissivity control layer of FIG. 1.
Figure 4B:
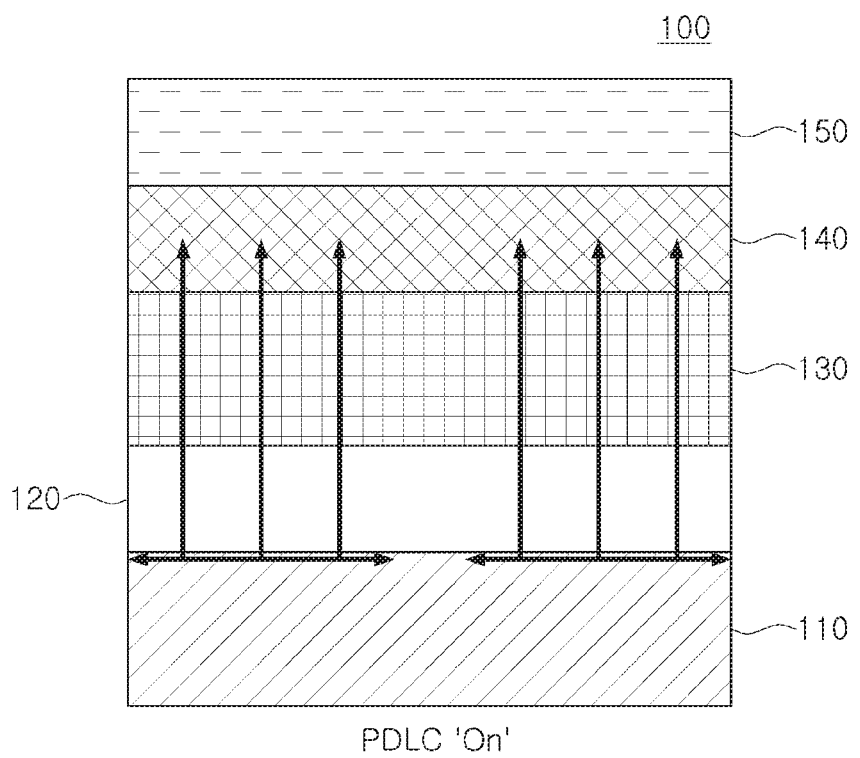
FIG. 4B is a view illustrating a case in which power is applied to the emissivity control layer of FIG. 1.

FIG. 4A is a view illustrating a case in which power is cut off to the emissivity control layer of FIG. 1, and FIG. 4B is a view illustrating a case in which power is applied to the emissivity control layer of FIG. 1.

Referring to FIG. 4A, radiant heat generated by electronic components of the circuit board 110 during the operation of the electronic device 100 may be transmitted to the emissivity control layer 130 through an air gap 120. Since the emissivity control layer 130 is in a state in which power is cut off, the liquid crystal molecules of the PDLC in the emissivity control layer 130 may be randomly arranged. The radiant heat transmitted to the emissivity control layer 130 may be scattered by the randomly arranged liquid crystal molecules and may not be transmitted to the heat dissipation film 140, such that a rapid temperature rise of a housing 150 may be suppressed.

Referring to FIG. 4B, radiant heat generated by electronic components of the circuit board 110 during the operation of the electronic device 100 may be transmitted to the emissivity control layer 130 through the air gap 120. Since the emissivity control layer 130 is in a state in which power is applied, the liquid crystal molecules of the PDLC in the emissivity control layer 130 may be uniformly arranged in a direction of an electric field. The radiant heat in the direction of the electric field transmitted to the emissivity control layer 130 may pass the liquid crystal molecules, uniformly arranged in the direction of the electric field to be transmitted to the heat dissipation film 140.

The heat dissipation film 140 may provide a diffusion path of heat generated in the circuit board 110. For example, the heat dissipation film 140 may transmit radiant heat transmitted from the emissivity control layer 130 in a direction parallel to the housing 150 to suppress a rapid temperature rise of the housing 150. The heat dissipation film 140 may be made of a material having a low emissivity and a high conductivity. For example, the heat dissipation film 140 may be a metal film such as silver, aluminum, and the like, and/or a graphite film. Further, in some example embodiments, the heat dissipation film 140 may be formed using a phase change material having a high heat capacity and a high thermal conductivity.

Figure 5:
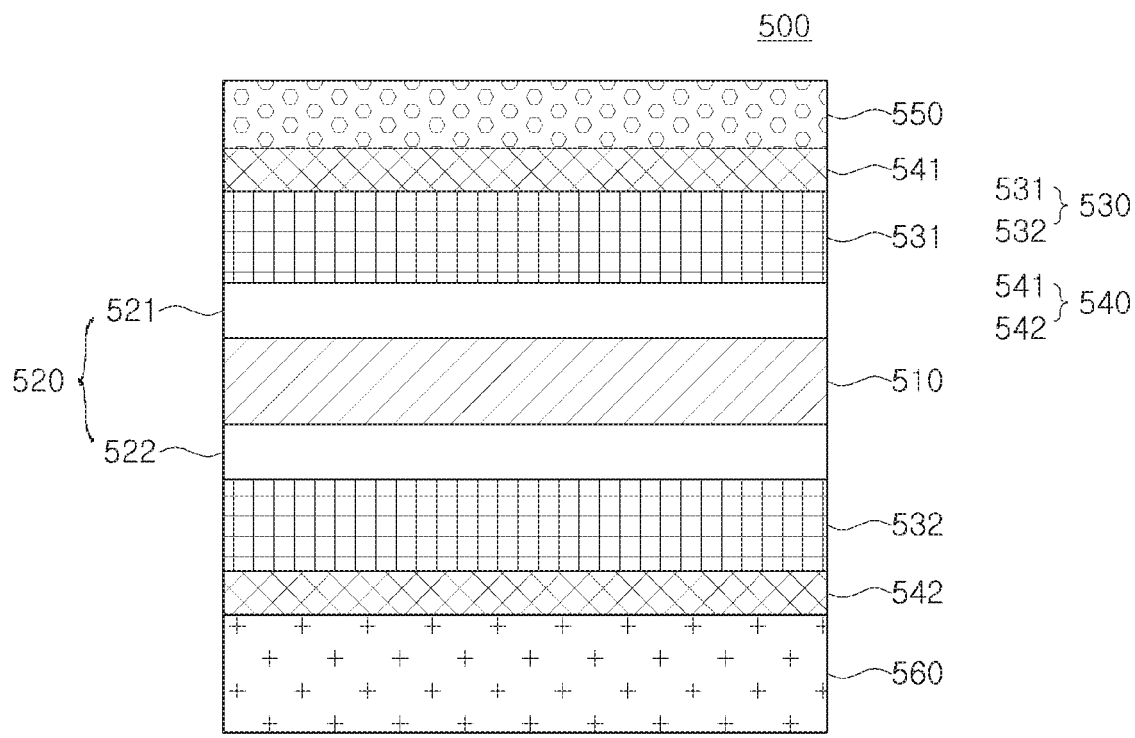
FIG. 5 is a cross-sectional view illustrating an electronic device according to some example embodiments of the present inventive concepts.

FIG. 5 is a cross-sectional view illustrating an electronic device according to some example embodiments of the present inventive concepts.

Referring to FIG. 5, an electronic device 500 may include a circuit board 510, first and second emissivity control layers 531 and 532, first and second heat dissipation films 541 and 542, a display panel 550, and/or a back case 560.

The first emissivity control layer 531 may be disposed to be spaced apart from an upper portion of the circuit board 510 by a first air gap 521. In addition, the second emissivity control layer 532 may be disposed to be spaced apart from a lower portion of the circuit board 510 by a second air gap 522. Here, the upper portion of the circuit board 510 may refer to a direction in which the circuit board 510 faces the display channel 550. The lower portion of the circuit board 510 may refer to a direction in which the circuit board 510 faces the back case 560.

The first heat dissipation film 541 and the display panel 550 may be sequentially disposed on the upper portion of the first emissivity control layer 531. In addition, the second dissipation film 542 and the back case 560 may be sequentially disposed on the lower portion of the second emissivity control layer 532.

The circuit board 510 may be a driving circuit board on which various electronic components necessary for the operation of the electronic device 500 are mounted. The electronic components mounted on the circuit board 510 may include various semiconductor chips, and may function as a heat source during the operation.

The heat generated by the circuit board 510 may include conductive heat transmitted along the circuit board 510 and/or radiant heat emitted to the upper portion and/or the lower portion of the circuit board 510 through the first and/or second air gaps 521 and 522.

The display panel 550 may operate to irradiate light according to driving currents, and may include an LED panel, an OLED panel, and the like.

The back case 560 may be a grip portion used by a user to grip the electronic device 500, and may be made of reinforced plastic, an alloy material, or the like.

The electronic device 500 may control the radiant heat emitted to the upper and/or lower portions of the circuit board 510 to be transmitted to the first and/or second heat dissipation films 541 and 542 by dynamically adjusting the emissivity of the first and/or second emissivity control layers 531 and 532. For example, by lowering the emissivity of the first and/or second emissivity control layers 531 and 532 in a busy state, the electronic device 500 may reduce the amount of radiant heat transmitted to the first and/or second heat dissipation films 541 and 542. In addition, by increasing the emissivity of the first and/or second emissivity control layers 531 and 532 in the idle state, the electronic device 500 may increase the amount of radiant heat transmitted to the first and/or second heat dissipation films 541 and 542.

In some example embodiments, the electronic device 500 may adjust the emissivity of the first emissivity control layer 531 and the emissivity of the second emissivity control layer 532 differently from each other. For example, the electronic device 500 may adjust the emissivity of the first emissivity control layer 531 to be lower than the emissivity of the second emissivity control layer 532, in order to reduce or prevent an increase in defects of the display panel 550 due to radiant heat. In addition, the electronic device 500 may adjust the emissivity of the second emissivity control layer 532 to be lower than the emissivity of the first emissivity control layer 531 in order to suppress a rapid temperature rise of the back case 560.

In some example embodiments, the electronic device 500 may adjust the emissivity of each of the first and second emissivity control layers 531 and 532 by applying or cutting off power to each of the first and second emissivity control layers 531 and 532. The first and/or second emissivity control layers 531 and 532 may be formed of a material having different emissivity depending on whether power is applied or not. For example, the first and/or second emissivity control layers 531 and 532 may include a PDLC transmission layer. Radiant heat transmission characteristics of the PDLC transmission layer are as described above with reference to FIGS. 2 to 4B.

The first and/or second heat dissipation films 541 and 542 may provide a diffusion path of heat generated in the circuit board 510. For example, the first heat dissipation film 541 may transmit radiant heat transmitted from the first emissivity control layer 531 in a direction parallel to the display panel 550, thereby suppressing radiant heat transmission to the display panel 550. The second heat dissipation film 542 may transmit radiant heat transmitted from the second emissivity control layer 532 in a direction parallel to the back case 560, thereby suppressing a rapid temperature rise of the back case 560.

At least one of the first and second heat dissipation films 541 and 542 may be formed of a material having a low emissivity and a high conductivity. In some example embodiments, at least one of the first and second heat dissipation films 541 and 542 may be a metal film such as silver, aluminum, and the like, and/or a graphite film. In addition, in some example embodiments, at least one of the first and second heat dissipation films 541 and 542 may be formed using a phase change material having a high heat capacity and a high thermal conductivity.

Figure 6:
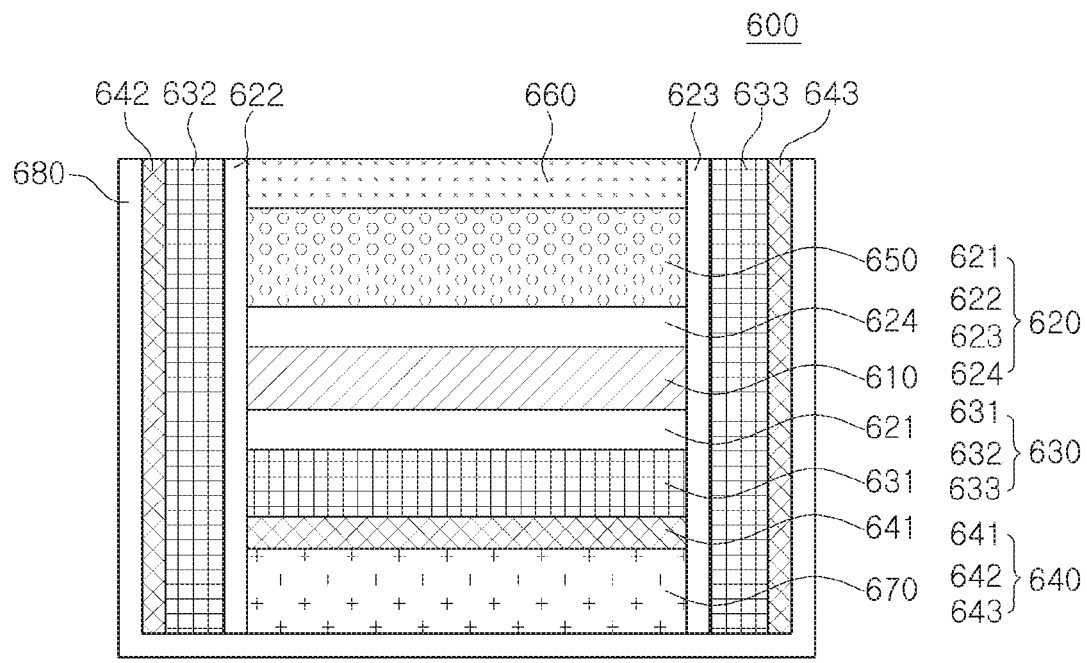
FIG. 6 is a cross-sectional view illustrating an electronic device according to some example embodiments of the present inventive concepts.

FIG. 6 is a cross-sectional view illustrating an electronic device according to some example embodiments of the present inventive concepts.

Referring to FIG. 6, an electronic device 600 may include first to third emissivity control layers 631 to 633, first to third heat dissipation films 641 to 643, a filter 650, a bracket 660, a display panel 670, and/or a body 680 constituting an appearance of the electronic device 600.

The first emissivity control layer 631 may be disposed to be spaced apart from a lower portion of a circuit board 610 by a first air gap 621. The second emissivity control layer 632 may be disposed to be spaced apart from a left side of the circuit board 610 by a second air gap 622. The third emissivity control layer 633 may be disposed to be spaced apart from a right side of the circuit board 610 by a third air gap 623. Here, the upper portion of the circuit board 610 may refer to a direction of the circuit board 610 facing the bracket 660.

The first heat dissipation film 641 and a display module 670 may be sequentially disposed on the lower portion of the first emissivity control layer 631. The second heat dissipation film 642 may be disposed on the left side of the second emissivity control layer 632. The third heat dissipation film 643 may be disposed on the right side of the third emissivity control layer 633.

The filter 650 and the bracket 660 may be sequentially disposed to be spaced apart from the upper portion of the circuit board 610 by the fourth air gap 624. The filter 650 may include an optical filter, such as a polarizing filter adjusting an amount of light or reducing reflected light, a neutral density ND filter removing light of a specific wavelength, an infrared filter transmitting or blocking light in an infrared region, and the like.

The bracket 660 may provide structural rigidity of the electronic device 600 or may provide a mounting space in which various components of the electronic device 600 are disposed. For example, a lens of the electronic device 600 may be disposed on the bracket 660, and may be secured in the electronic device 600 by the bracket 660.

In addition, the bracket 660 may provide a heat dissipation path of heat generated by various electronic components of the electronic device 600. For example, the bracket 660 may be made of a metal material having high thermal conductivity, and may be used as a heat sink or a heat diffusion path of various electronic components, becoming a heat source of the electronic device 600.

The circuit board 610 may be a driving circuit board on which various electronic components necessary for the operation of the electronic device 600 are mounted. The electronic components mounted on the circuit board 610 may include various semiconductor chips, and may function as a heat source during the operation.

The heat generated by the circuit board 610 may include conductive heat transmitted along the circuit board 610 and/or radiant heat emitted to upper and lower portions and/or a side surface of the circuit board 610 through the first to fourth air gaps 621 to 624.

The electronic device 600 may control radiant heat emitted from the circuit board 610 to be transmitted to the first to third heat dissipation films 641 to 643 by dynamically adjusting the emissivity of the first to third emissivity control layers 631 to 633. For example, by lowering the emissivity of the first to third emissivity control layers 631 to 633 in the busy state, the electronic device 600 may reduce the amount of radiant heat transmitted to the first to third heat dissipation films 641 to 643. In addition, by increasing the emissivity of the first to third emissivity control layers 631 to 633 in the idle state, the electronic device 600 may increase the amount of radiant heat transmitted to the first to third heat dissipation films 641 to 643.

In some example embodiments, the electronic device 600 may adjust the emissivity of each of the first to third emissivity control layers 631 to 633 differently from each other. For example, the electronic device 600 may adjust the emissivity of the first emissivity control layer 631 to be lower than the emissivity of the second and third emissivity control layers 632 and 633 in order to reduce or prevent a defect increase in the display panel 670 due to radiant heat.

In some example embodiments, the electronic device 600 may adjust the emissivity of each of the first to third emissivity control layers 631 to 633 by applying or cutting off power to each of the first to third emissivity control layers 631 to 633. The first to third emissivity control layers 631 to 633 may be formed of a material in which the emissivity varies depending on whether power is applied or not. For example, at least one of the first to third emissivity control layers 631 to 633 may include a PDLC transmission layer. Radiant heat transmission characteristics of the PDLC transmission layer are as described above with reference to FIGS. 2 to 4B.

The first to third heat dissipation films 641 to 643 may provide a heat dissipation element or a heat diffusion path of the radiant heat transmitted from the first to third emissivity control layers 631 to 633. The first to third heat dissipation films 641 to 643 may be formed of a material having a low emissivity and a high conductivity. In some example embodiments, at least one of the first to third heat dissipation films 641 to 643 may be a metal film such as silver, aluminum, and the like, and/or a graphite film. In addition, in some example embodiments, at least one of the first to third heat dissipation films 641 to 643 may be formed using a phase change material having a high heat capacity and a high thermal conductivity.

Hereinafter, a method in which the electronic device according to some example embodiments of the present inventive concepts dynamically controls the emissivity will be described with reference to FIGS. 7 to 10.

Figure 7:
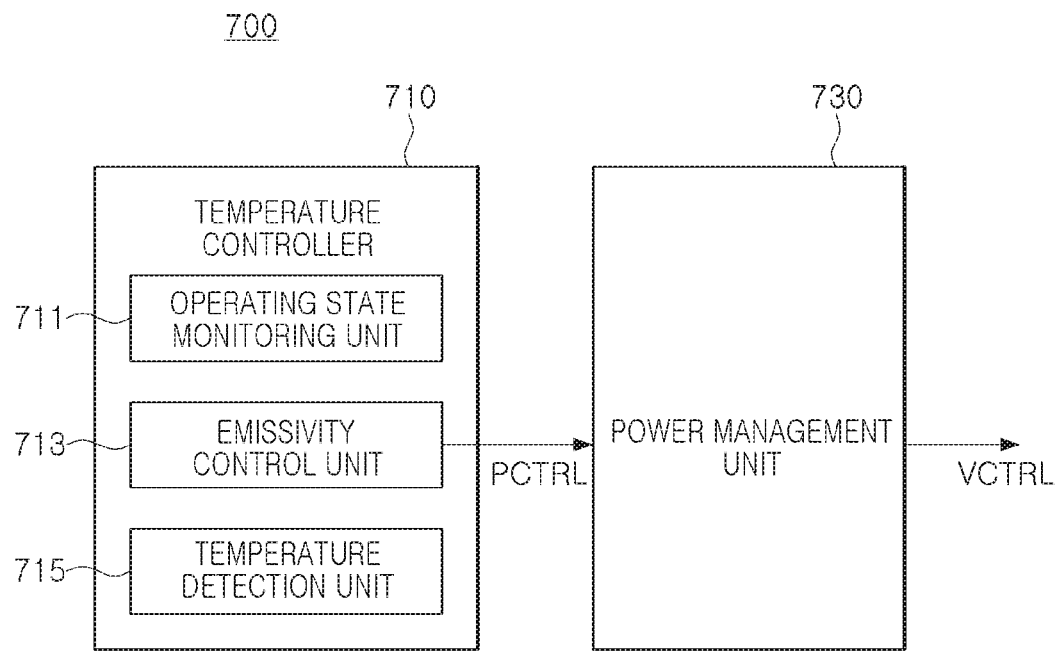
FIG. 7 is a block diagram illustrating a configuration of an electronic device according to some example embodiments of the present inventive concepts.
Figure 8:
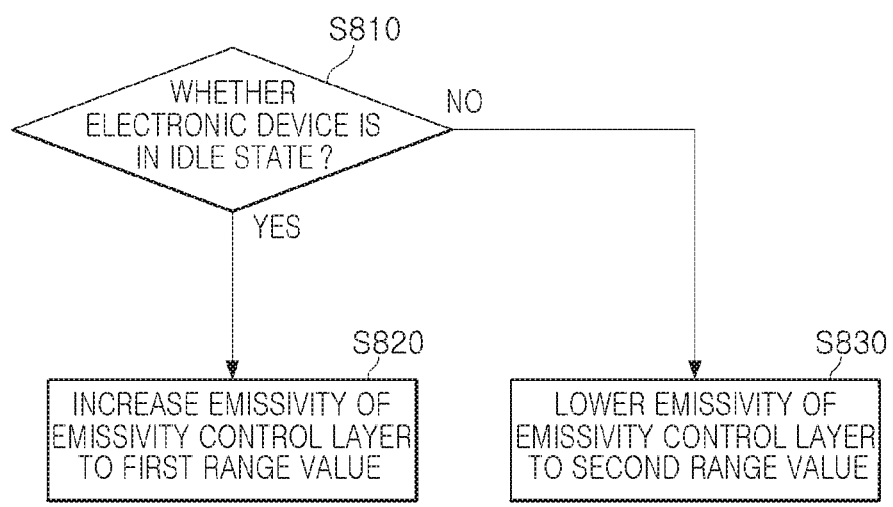
FIG. 8 is a flow chart illustrating a method for adjusting emissivity of an electronic device according to some example embodiments of the present inventive concepts.

FIG. 7 is a block diagram illustrating a configuration of an electronic device according to some example embodiments of the present inventive concepts, and FIG. 8 is a flow chart illustrating a method for adjusting the emissivity of an electronic device according to some example embodiments of the present inventive concepts.

Referring to FIG. 7, an electronic device 700 may include a temperature controller 710 including an operating state monitoring unit 711, an emissivity control unit 713, a temperature detection unit 715, and/or a power management unit 730.

The temperature controller 710 may adjust the emissivity of the emissivity control layer by controlling a level of power applied to the emissivity control layer according to an operating state of the electronic device 700. In some example embodiments, when the electronic device 700 is in the idle state, not performing a foreground operation, the temperature controller 710 may adjust the emissivity of the emissivity control layer to a first range value by increasing the level of power applied to the emissivity control layer. When the electronic device 700 is in the busy state, performing a foreground operation, the temperature controller 710 may adjust the emissivity of the emissivity control layer to a second range value by decreasing the level of power applied to the emissivity control layer. The first range value may be greater than the second range value. For example, the temperature controller 710 may apply a voltage of DC 1.5V to the emissivity control layer to adjust the emissivity value of the emissivity control layer to a value of 0.6 or more and 1.0 or less. In addition, the temperature controller 710 may apply a voltage of DC 0.3 or less to the emissivity control layer to adjust the emissivity value of the emissivity control layer to a value of 0.4 or less and 0 or more. In each case, the emissivity value of the emissivity control layer may increase or decrease in proportion to the level of power applied to the emissivity control layer.

In addition, by controlling the level of power applied to the emissivity control layer based on temperature information of the electronic device 700, the temperature controller 710 may adjust the emissivity of the emissivity control layer. In some example embodiments, when the temperature of the electronic component in the electronic device 700 exceeds a predetermined (or alternatively, given) critical temperature, the temperature controller 710 may adjust the emissivity of the emissivity control layer to a first range value by increasing the level of power applied to the emissivity control layer. In addition, when the temperature of the housing or the back case of the electronic device 700 exceeds the predetermined (or alternatively, given) critical temperature, the temperature controller 710 may adjust the emissivity of the emissivity control layer to a second range value, lower than the first range value, by decreasing the level of power applied to the emissivity control layer.

In order to perform such an operation, the temperature controller 710 may include the operating state monitoring unit 711, the emissivity control unit 713 and the temperature detection unit 715. Each component of the temperature controller 710 may be implemented in hardware or software, or in a combination thereof. The temperature controller 710 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. Hereinafter, each component of the temperature controller 710 will be described in more detail with reference to FIG. 8.

Referring to FIG. 8, the operating state monitoring unit 711 may determine whether the electronic device 700 is in the idle state, not performing a foreground operation (S810). In some example embodiments, the operating state monitoring unit 711 may use an operating state indication signal or a registry information generated based on changes of levels of the operating power of various electronic components to determine whether the operating state of the electronic device 700 is an idle state, or not.

For example, when the workload of the electronic device 700 increases, the power management unit 730 may increase the level of the operating power such that the operating voltage or the operating frequency of various electronic components increases. In addition, when the workload of the electronic device 700 decreases, the power management unit 730 may decrease the level of the operating power, such that the operating voltage or the operating frequency of various electronic components decreases. When the level of the operating power of various electronic components becomes greater than a predetermined (or alternatively, given) reference value, the power management unit 730 may generate an operating state indication signal or a registry information, indicating that the electronic device 700 is in a busy state (or in an active state). In addition, when the level of the operating power of various electronic components becomes smaller than a predetermined (or alternatively, given) reference value, the power management unit 730 may generate the operating state indication signal or the registry information, indicating that the electronic device 700 is in an idle state. The operating state monitoring unit 711 may detect whether the operating state indication signal or the registry information is generated or changed by the power management unit 730 to determine the operating state of the electronic device 700.

When the electronic device 700 is in an idle state ('YES' in S810), the emissivity control unit 713 may promote radiant heat generated inside the electronic device 700 to be transmitted to a heat sink (for example, a heat dissipation film) by adjusting the emissivity of the emissivity control layer to a first range value (S820). For example, the emissivity control unit 713 may output a control signal PCTR for applying power to the PDLC transmission layer included in the emissivity control layer to the power management unit 730. The power management unit 730 may increase the emissivity of the emissivity control layer by applying power to the PDLC transmission layer included in the emissivity control layer based on the control signal PCTR received from the emissivity control layer 713.

When the electronic device 700 is in a busy state ('NO' in S810), the emissivity control unit 713 may suppress radiant heat generated inside the electronic device 700 to be transmitted to the heat sink (for example, the heat dissipation film) by adjusting the emissivity of the emissivity control layer to a second range value, lower than the first range value described above. For example, the electronic device 700 may lower the emissivity of the emissivity control layer by cutting off power to the PDLC transmission layer included in the emissivity control layer (S830).

The electronic device 700 may delay an entry point of performance throttling and suppress a rapid temperature rise of the case or the body to ensure the user's safety, by dynamically adjusting the emissivity of the emissivity control layer based on the operating state.

Figure 9:
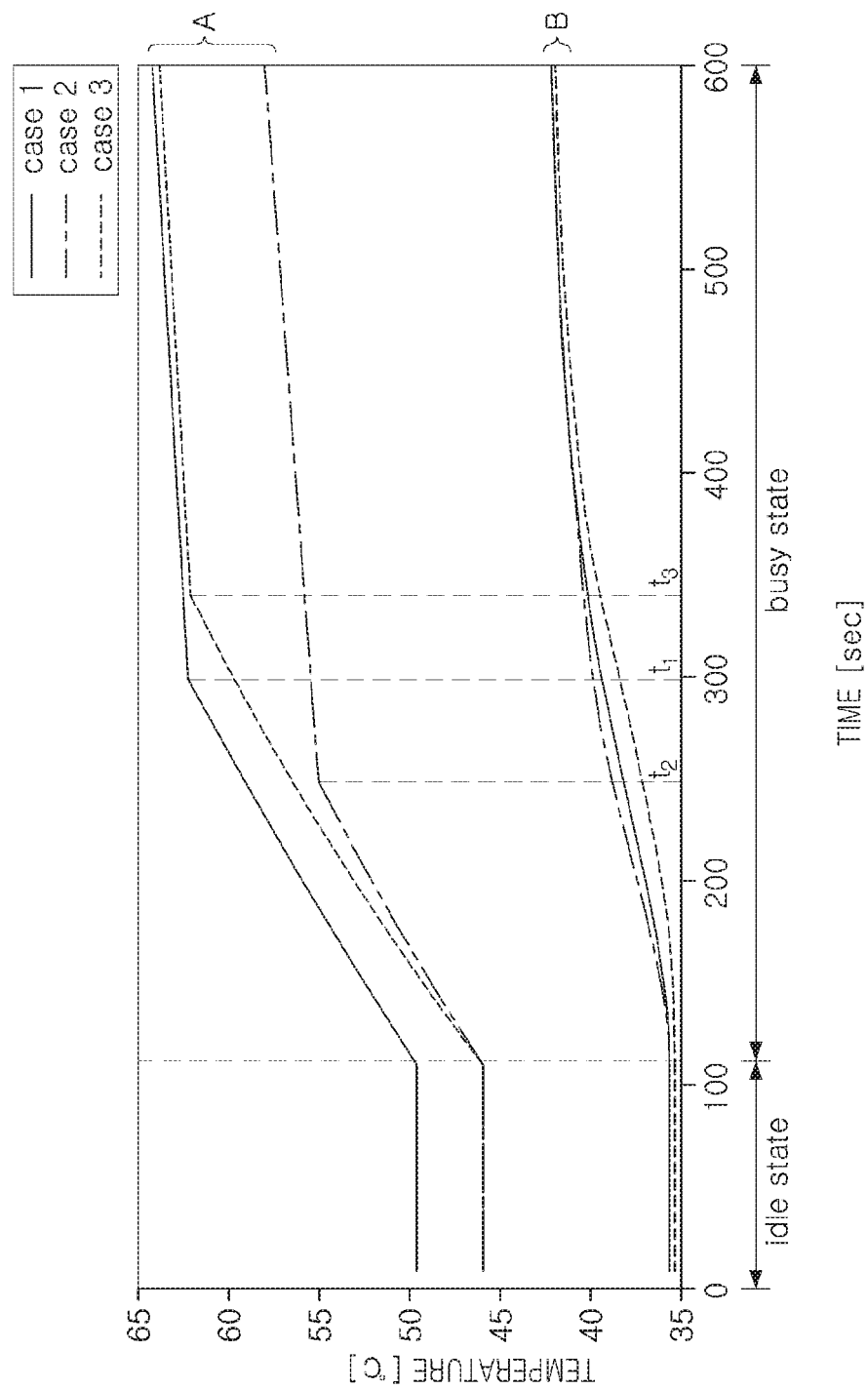
FIG. 9 is a view illustrating a simulation result of an operation for adjusting emissivity of an electronic device according to some example embodiments of the present inventive concepts.

A simulation result of the method for adjusting the emissivity of the electronic device 700 is as illustrated in FIG. 9.

A graph of FIG. 9 illustrates the temperature change of the internal electronic components (group 'A') and the temperature change of the housing (group 'B'), as the state of the electronic device 700 changes from the idle state to the busy state.

In the graph of FIG. 9, 'case1' and 'case2' indicate cases in which the emissivity of the emissivity control layer in the electronic device 700 is constantly set to be 'low' or 'high,' regardless of the operating state of the electronic device 700. 'Case 3' indicates a case in which the emissivity of the emissivity control layer is adjusted according to the change of the operating state of the electronic device 700. 'Case 3' corresponds to some example embodiments of the present inventive concepts.

Referring to FIG. 9, in cases in which the emissivity of the emissivity control layer is high in the idle state of the electronic device 700 ('case 2' and 'case 3'), compared to the case in which the emissivity of the emissivity control layer is low ('case 1'), the temperature of the internal electronic components (group 'A') may be relatively low since the internal radiant heat of the electronic device 700 is sufficiently transmitted to the heat sink (for example: heat radiation film).

In cases in which the emissivity of the emissivity control layer is low in the busy state of the electronic device 700 ('case 1' and 'case 3'), compared to the case in which the emissivity of the emissivity control layer is high ('case 2'), the internal radiant heat of the electronic device 700 may not be sufficiently transmitted to the heat sink and the temperature (group 'A') of the internal electronic components gradually rises, such that an entry point of the performance throttling may be relatively delayed (that is, 't1 and t3>t2'). As the entry point of the performance throttling is delayed, the electronic device 700 may perform the foreground operation for a longer time.

In summary, according to some example embodiments of the present inventive concepts ('case 3'), the electronic device 700 may lower the temperature of the internal electronic components in the idle state. In addition, according to some example embodiments of the present inventive concepts ('case 3'), the electronic device 700 may suppress the rapid temperature rise of the internal electronic components in the busy state and may delay the entry point of the performance throttling.

Figure 10:
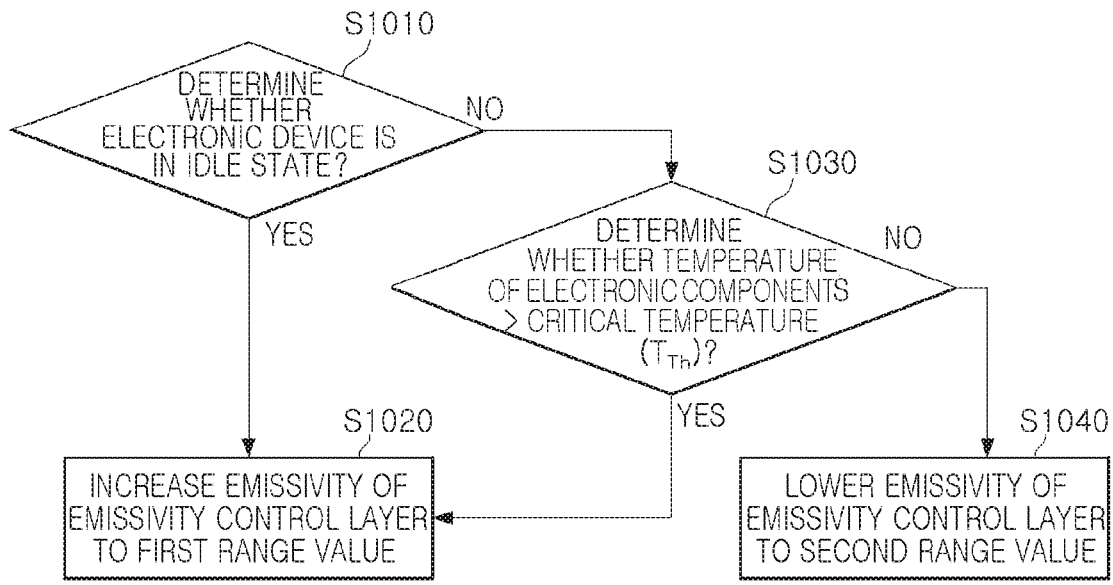
FIG. 10 is a view illustrating a method for adjusting emissivity of an electronic device according to some example embodiments of the present inventive concepts.

FIG. 10 is a flow chart illustrating a method for adjusting emissivity of an electronic device according to some example embodiments of the present inventive concepts.

Referring to FIGS. 7 and 10, the temperature controller 710 may control the temperature of the electronic device 700 by adjusting the emissivity of the emissivity control layer based on the operating state and the internal temperature information of the electronic device 700.

The operating state monitoring unit 711 may determine whether the electronic device 700 is in the idle state, not performing the foreground operation (S1010).

In a case in which the electronic device 700 is in the idle state ('YES' in S1010), the emissivity control unit 713 may promote radiant heat generated inside the electronic device 700 to be transmitted to the heat sink (for example, heat dissipation film) by adjusting the emissivity of the emissivity control layer to a first range value (S1020). For example, the emissivity control unit 713 may output the control signal PCTR for applying power to the PDLC transmission layer included in the emissivity control layer to the power management unit 730. The power management unit 730 may increase the emissivity of the emissivity control layer by applying power to the PDLC transmission layer included in the emissivity control layer based on the control signal PCTR received from the emissivity control unit 713 (S1020).

In a case in which the electronic device 700 is in the busy state (NO' in S1010), the emissivity control unit 713 may adjust the emissivity of the emissivity control layer based on the internal temperature of the various electronic components in the electronic device 700. In order to perform the function, the electronic device 700 may further include a temperature detection unit 715.

The temperature detection unit 715 may determine whether the temperature of various electronic components in the electronic device 700 detected using a temperature sensor exceeds a predetermined (or alternatively, given) critical temperature Tth (S1030).

In a case in which the temperature of various electronic components in the electronic device 700 exceeds the predetermined (or alternatively, given) critical temperature Tth ('YES' in S1030), the emissivity control unit 713 may adjust the emissivity of the emissivity control layer to a first range value (S1020). For example, when the internal temperature of the electronic device 700 is higher than that in the normal idle state, such as when the electronic device 700 is in a boot state after a sudden power off SPO occurs in the busy state, the emissivity control unit 713 may reduce the internal temperature of the electronic device 700 by increasing the emissivity of the emissivity control layer.

In a case in which the temperature of various electronic components in the electronic device 700 does not exceed the predetermined (or alternatively, given) critical temperature Tth ('NO' in S1030), the emissivity control unit 713 may adjust the emissivity of the emissivity control layer to a second range value, lower than the first level described above (S1040). The emissivity control unit 713 may suppress the radiant heat generated inside the electronic device 700 to be transmitted to the heat sink (for example, heat dissipation film) by adjusting the emissivity of the emissivity control layer to the second range value (S1040).

The electronic device 700 may delay an entry point of the performance throttling and suppress the rapid temperature rise of the case or the body to ensure a user safety, by dynamically adjusting the emissivity of the emissivity control layer based on the operating state. In addition, the electronic device 700 may suppress the rapid temperature rise of various electronic components to reduce or prevent performance degradation and life span reduction, by dynamically adjusting the emissivity of the emissivity control layer based on the internal temperature.

Figure 11:
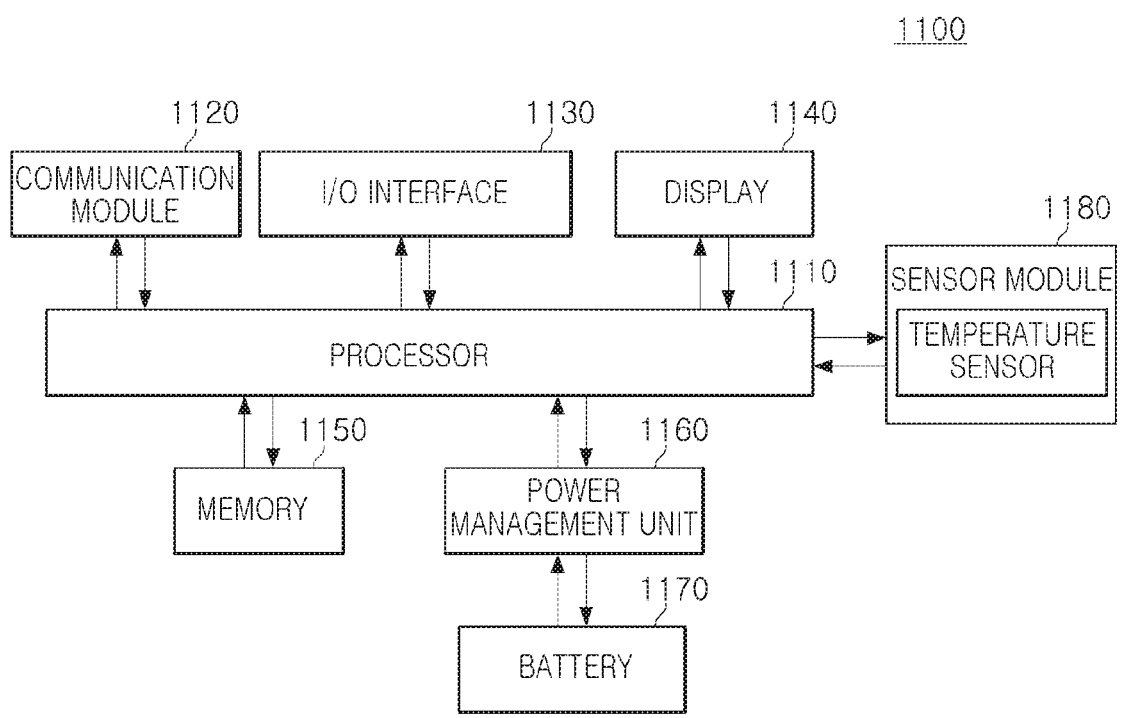
FIG. 11 is a block diagram illustrating an electronic device according to some example embodiments of the present inventive concepts.

FIG. 11 is a block diagram illustrating an electronic device according to some example embodiments of the present inventive concepts.

Referring to FIG. 11, an electronic device 1100 may include a processor 1110, a communication module 1120, an I/O interface 1130, a display 1140, a memory 1150, a power management unit 1160, a battery 1170 and/or a sensor module 1180.

The processor 1110 may control an overall operation of the electronic device 1100, and may dynamically adjust the emissivity of the emissivity control layer, in particular, according to an operating state of the electronic device 1100. The processor 1110 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The communication module 1120 may include a WiFi module, a Bluetooth module, a NFC module, a cellular module, a RF module, or the like.

The I/O interface 1130 may transmit commands or data input from a user or other external devices to other components of the electronic device 1100, and may output commands or data received from the other components of the electronic device 1100 to a user or other external devices.

The display 1140 may display various contents such as a text, images, and the like. The display 1140 may include a LCD display, an OLED display, a MEMS display, or the like. The display 1140 may be implemented in a touch screen manner.

The memory 1150 may include a volatile memory, a nonvolatile memory, or the like. The memory 1150 may store various commands or data of the electronic device 1100. In some example embodiments, the memory 1150 may store the critical temperature Tth for the internal temperature used to adjust the emissivity of the emissivity control layer in the electronic device 1100.

The power management unit 1160 may manage capacity of the battery 1170, and may provide and manage power to other components of the electronic device 1100 from the battery 1170. In some example embodiments, the power management unit 1160 may apply or cut off power to the emissivity control layer according to a power control signal PCTR received from the temperature controller. The temperature controller may be implemented using the processor 1110 or may be implemented in a form of firmware.

The sensor module 1180 may include a contact or a non-contact temperature sensor for measuring an internal temperature of the electronic device 1100, a case temperature, or the like. The sensor module 1180 may further include various sensors for measuring various values associated with the electronic device 1100, such as a gesture sensor, a gyro sensor, an air pressure sensor, a magnetic sensor, an acceleration sensor, a temperature/humidity sensor, an illuminance sensor, an iris sensor, a fingerprint sensor, or the like.

As set forth above, an electronic device according to some example embodiments of the present inventive concepts may efficiently control the temperature of the electronic device by including an emissivity control layer in which emissivity is dynamically controlled.

In addition, the electronic device according to some example embodiments of the present inventive concepts may delay an entry point of performance throttling by keeping the emissivity of the emissivity control layer low in the busy state of the electronic device.

In addition, the electronic device according to some example embodiments of the present inventive concepts may suppress a rapid temperature rise of a surface temperature to protect a user by keeping the emissivity of the emissivity control layer low in the busy state of the electronic device.

The various advantages and effects of the present invention are not limited to the above description, and can be more easily understood in the course of describing some example embodiments of the present inventive concepts.

While some example embodiments have been shown and described above, it will be apparent to those skilled in the art that modifications and variations could be made without departing from the scope of the present inventive concepts as defined by the appended claims.

What is claimed is:

1. An electronic device comprising:
   a circuit board including at least one electronic component;
   a housing accommodating the circuit board;
   an emissivity control layer configurable to selectively transmit radiant heat generated by the electronic component; and
   a temperature controller configured to control an amount of the radiant heat transmitted to the housing by adjusting emissivity of the emissivity control layer,
   wherein the temperature controller adjusts the emissivity of the emissivity control layer to a first range value in response to the electronic device being in an idle state, and adjusts the emissivity of the emissivity control layer to a second range value, lower than the first range value, in response to the electronic device being in a busy state.

2. The electronic device of claim 1, further comprising:
a heat dissipation film between the emissivity control layer and the housing, the heat dissipation film configured to diffuse heat transmitted from the emissivity control layer.

3. The electronic device of claim 2, wherein the heat dissipation film comprises a metal film, a graphite film, or a phase change material layer.

4. The electronic device of claim 1, wherein the temperature controller is further configured to,
determine whether an operating state of the electronic device is the idle state,
detect a temperature of the electronic device, and
adjust the emissivity of the emissivity control layer by controlling a power level applied to the emissivity control layer based on the operating state and the temperature of the electronic device.

5. The electronic device of claim 1, wherein the temperature controller is further configured to adjust the emissivity of the emissivity control layer to the first range value in response to the temperature of the electronic device exceeding a critical temperature.

6. The electronic device of claim 1, wherein the temperature controller is further configured to adjust the emissivity of the emissivity control layer to the first range value in response to an operating state of the electronic device being a boot state after a sudden power off SPO occurs.

7. The electronic device of claim 1, wherein the emissivity control layer comprises at least one of a polymer dispersed liquid crystal PDLC layer, a polymer stabilized cholesteric texture PSCT layer, and a suspended particle device SPD layer.

8. The electronic device of claim 1, wherein the emissivity control layer comprises:
a transmission layer having a different degree of transmitting the radiant heat according to a level of input power;
first and second electrode layers disposed in upper and lower portions of the transmission layer, respectively, and connected to an external power source to supply the input power to the transmission layer; and
an electrode connection layer disposed on at least one side of the transmission layer, and electrically connecting the first and second electrode layers.

9. The electronic device of claim 8, wherein at least one of the first and second electrode layers comprises a transparent electrode material.

10. The electronic device of claim 8, wherein the electrode connection layer comprises a flexible printed circuit board.

11. An electronic device comprising:
a first emissivity control layer spaced apart from an upper portion of a circuit board including at least one electronic component, the first emissivity control layer having a first variable emissivity configurable to adjust a transmission amount of radiant heat generated by the electronic component;
a first heat dissipation film on the first emissivity control layer, configured to diffuse heat transmitted from the first emissivity control layer;
a second emissivity control layer spaced apart from a lower portion of the circuit board, and having a second variable emissivity configurable to adjust the transmission amount of the radiant heat;
a second heat dissipation film on the second emissivity control layer, and configured to diffuse heat transmitted from the second emissivity control layer; and
a temperature controller configured to control the first and second variable emissivity by adjusting a power level respectively applied to each of the first and second emissivity control layers.

12. The electronic device of claim 11, wherein the temperature controller is further configured to,
determine whether an operating state of the electronic device is an idle state,
detect temperature information of a housing accommodating the electronic component and the circuit board, and
adjust the first and second variable emissivity to one of a first range value or a second range value, lower than the first range value, based on the operating state and the temperature information.

13. The electronic device of claim 12, wherein the temperature controller is further configured to,
adjust the first and second variable emissivity to the first range value in response to the electronic device in the idle state, and
adjust the first and second variable emissivity to the second range value in response to the electronic device being in a busy state.

14. The electronic device of claim 12, wherein the temperature controller is further configured to
adjust the second variable emissivity to the second range value in response to the temperature of a back case of the electronic device, on a lower portion of the second heat dissipation film, exceeding a critical temperature.

15. The electronic device of claim 12, wherein the temperature controller is further configured to adjust the first and second variable emissivity to the first range value in response to the temperature of the electronic component exceeding a critical temperature.

16. The electronic device of claim 11, wherein each of the first and second emissivity control layers comprises;
a transmission layer having a variable emissivity value configurable to adjust thermal transmittance;
first and second electrode layers disposed in upper and lower portions of the transmission layer, respectively, and connected to an external power source; and
an electrode connection layer disposed on at least one side of the transmission layer, and electrically connecting the first and second electrode layers.

17. The electronic device of claim 16, wherein at least one of the first and second electrode layers is integrally formed with at least one of the first and second heat dissipation films.

18. An electronic device comprising:
a circuit board on which at least one electronic component is mounted;
a housing accommodating the circuit board;
first to third layers spaced apart from a lower portion and both sides of the circuit board, respectively, the first to third layers having a variable thermal transmittance configurable to control an amount of radiant heat generated by the electronic component transmitted to the housing, wherein each of the first to third layers includes,
a transmission layer having variable emissivity based on whether an operating state of the electronic device is an idle state, and a heat dissipation film configured to diffuse the radiant heat transmitted from the transmission layer; and a temperature controller configured to respectively control the variable thermal transmittance of the first to third layers by adjusting the variable emissivity of the first to third layers by adjusting a power level applied to the first to third layers.

19. The electronic device of claim 18, wherein the transmission layer comprises at least one of a polymer dispersed liquid crystal PDLC layer, a polymer stabilized cholesteric texture PSCT layer, and a suspended particle device SPD layer.

20. The electronic device of claim 18, wherein the heat dissipation film comprises at least one of a metal film, a graphite film, or a phase change material layer.

* * * * *